United States Patent
Jonczyk et al.

(10) Patent No.: US 10,439,095 B2
(45) Date of Patent: Oct. 8, 2019

(54) METHODS FOR CREATING A SEMICONDUCTOR WAFER HAVING PROFILED DOPING AND WAFERS AND SOLAR CELL COMPONENTS HAVING A PROFILED FIELD, SUCH AS DRIFT AND BACK SURFACE

(71) Applicant: 1366 TECHNOLOGIES INC., Bedford, MA (US)

(72) Inventors: Ralf Jonczyk, Concord, MA (US); Brian D. Kernan, Andover, MA (US); G. D. Stephen Hudelson, Billerica, MA (US); Adam M. Lorenz, Arlington, MA (US); Emanuel M. Sachs, Newton, MA (US)

(73) Assignee: 1366 TECHNOLOGIES, INC., Bedford, MA (US)

( * ) Notice: Subject to any disclaimer, the term of this patent is extended or adjusted under 35 U.S.C. 154(b) by 0 days.

(21) Appl. No.: 15/546,030

(22) PCT Filed: Oct. 14, 2015

(86) PCT No.: PCT/US2015/055460
§ 371 (c)(1),
(2) Date: Jul. 25, 2017

(87) PCT Pub. No.: WO2016/122731
PCT Pub. Date: Aug. 4, 2016

(65) Prior Publication Data
US 2018/0019365 A1      Jan. 18, 2018

Related U.S. Application Data

(60) Provisional application No. 62/239,115, filed on Oct. 8, 2015, provisional application No. 62/107,711, filed on Jan. 16, 2015.

(51) Int. Cl.
*H01L 21/00* (2006.01)
*H01L 31/18* (2006.01)
(Continued)

(52) U.S. Cl.
CPC ........ *H01L 31/1804* (2013.01); *C30B 11/002* (2013.01); *C30B 19/12* (2013.01);
(Continued)

(58) Field of Classification Search
CPC ........... H01L 31/02167; H01L 31/1804; H01L 31/056; H01L 31/0288
(Continued)

(56) References Cited

U.S. PATENT DOCUMENTS

2002/0009895 A1   1/2002  Nishida
2008/0138456 A1   6/2008  Fork et al.
(Continued)

FOREIGN PATENT DOCUMENTS

JP   2006093434      4/2006
WO   2013/142892 A1  10/2013

OTHER PUBLICATIONS

Office Communication from Intellectual Property Office of Singapore, Invitation to Respond to Written Opinion, for Patent Application No. 11201705410P, dated Nov. 30, 2018, 1 page.
(Continued)

*Primary Examiner* — David S Blum
(74) *Attorney, Agent, or Firm* — The Marbury Law Group, PLLC

(57) ABSTRACT

A semiconductor wafer forms on a mold containing a dopant. The dopant dopes a melt region adjacent the mold. There, dopant concentration is higher than in the melt bulk. A wafer starts solidifying. Dopant diffuses poorly in solid semiconductor. After a wafer starts solidifying, dopant cannot enter the melt. Afterwards, the concentration of dopant
(Continued)

in the melt adjacent the wafer surface is less than what was present where the wafer began to form. New wafer regions grow from a melt region whose dopant concentration lessens over time. This establishes a dopant gradient in the wafer, with higher concentration adjacent the mold. The gradient can be tailored. A gradient gives rise to a field that can function as a drift or back surface field. Solar collectors can have open grid conductors and better optical reflectors on the back surface, made possible by the intrinsic back surface field.

20 Claims, 8 Drawing Sheets

(51) Int. Cl.
| | |
|---|---|
| *H01L 31/0224* | (2006.01) |
| *H01L 31/068* | (2012.01) |
| *H01L 31/056* | (2014.01) |
| *H01L 31/0216* | (2014.01) |
| *H01L 31/0288* | (2006.01) |
| *C30B 29/06* | (2006.01) |
| *C30B 28/04* | (2006.01) |
| *C30B 19/12* | (2006.01) |
| *C30B 35/00* | (2006.01) |
| *C30B 31/04* | (2006.01) |
| *C30B 11/00* | (2006.01) |
| *C30B 31/02* | (2006.01) |

(52) U.S. Cl.
CPC .............. *C30B 28/04* (2013.01); *C30B 29/06* (2013.01); *C30B 31/02* (2013.01); *C30B 31/04* (2013.01); *C30B 35/002* (2013.01); *H01L 21/00* (2013.01); *H01L 31/0288* (2013.01); *H01L 31/02167* (2013.01); *H01L 31/022425* (2013.01); *H01L 31/056* (2014.12); *H01L 31/068* (2013.01); *H01L 31/182* (2013.01); *Y02E 10/52* (2013.01); *Y02E 10/546* (2013.01); *Y02E 10/547* (2013.01); *Y02P 70/521* (2015.11)

(58) Field of Classification Search
USPC ........................ 438/61, 87; 257/147; 385/147
See application file for complete search history.

(56) References Cited

U.S. PATENT DOCUMENTS

| | | | |
|---|---|---|---|
| 2008/0220544 A1* | 9/2008 | Bucher | ................... C30B 11/04 438/11 |
| 2009/0014840 A1 | 1/2009 | Schonecker | |
| 2009/0050204 A1 | 2/2009 | Habib | |
| 2009/0092745 A1* | 4/2009 | Pavani | .................... C30B 29/06 427/74 |
| 2010/0006138 A1 | 1/2010 | Rao | |
| 2010/0275995 A1 | 11/2010 | Kaes et al. | |
| 2012/0125424 A1* | 5/2012 | Wenham | ............. H01L 21/2252 136/256 |
| 2013/0157401 A1* | 6/2013 | Jager | ................... H01L 21/2254 438/61 |
| 2014/0065764 A1 | 3/2014 | Scardera et al. | |

OTHER PUBLICATIONS

Search Report from Intellectual Property Office of Singapore for Patent Application No. 11201705410P, dated Nov. 27, 2018, 3 pages.
Written Opinion from Intellectual Property Office of Singapore, for Patent Application No. 11201705410P, dated Nov. 27, 2018, 6 pages.
Extended European Search Report for European Patent Application No. 15880612.5, dated Nov. 20, 2018, 16 pages.
European Office Communication for Patent Application No. 15880612.5, dated Dec. 7, 2018, 1 page.
Zheng G. F. et al., "High-Efficiency Drift-Field Thin-Film Silicon Solar Cells by Liquid-Phase Epitaxy and substrate Thinning," IEEE Photovoltaic Specialists Conference 1996, vol. 25, No. 25, pp. 693-696, (1996).
Lee, G.H. et al., "Fabrication of Polycrystalline Si Wafer by Vacuum Casting and the Effect of Mold Coating Materials," Journal of Crystal Growth, vol. 233, No. 1-2, pp. 45-51, (2001).
Baliga, B.J., "Liquid Phase Epitaxial Silicon Diodes: N-Epitaxial Layers on Boron-Doped Substrates," Journal of Electrochemical STY, vol. 127, No. 5, pp. 1168-1172, (1980).
Bergmann, R. et al., "Silicon Films Incorporating a Drift-Field Grown by Liquid Phase Epitaxy for Solar Cell Applications," Solar Energy Materials and Solar Cells, vol. 31, No. 3, pp. 447-451, (1993).
International Search Report for International Application No. PCT/US2015/055460 dated Mar. 2, 2016, 4 pages.

* cited by examiner

METHODS FOR CREATING A SEMICONDUCTOR WAFER HAVING PROFILED DOPING AND WAFERS AND SOLAR CELL COMPONENTS HAVING A PROFILED FIELD, SUCH AS DRIFT AND BACK SURFACE

RELATED DOCUMENTS

This is the 35 U.S.C. § 371 U.S. National Phase of Patent Cooperation Treaty application No. PCT/US2015/055,460, entitled, METHODS FOR CREATING A SEMICONDUCTOR WAFER HAVING PROFILED DOPING AND WAFERS AND SOLAR CELL COMPONENTS HAVING A PROFILED FIELD, SUCH AS DRIFT AND BACK SURFACE, International filing date of Oct. 14, 2015, to which the benefit of priority is hereby claimed. The PCT application claims the benefit of and priority to U.S. Provisional application, No. 62/107,711, filed on Jan. 26, 2015, Entitled METHODS OF CREATING A SEMICONDUCTOR WAFER HAVING A DRIFT FIELD WITH PROFILED DOPING AND WAFERS HAVING A PROFILED DRIFT FIELD, inventors Ralf Jonczyk, et al., Applicant 1366 Technologies, Inc., of Bedford, Mass., the complete disclosure of which is hereby incorporated by reference. Priority is hereby also claimed to U.S. Provisional application, No. 62/239,115 filed on Oct. 8, 2015, entitled METHODS FOR CREATING A SEMICONDUCTOR WAFER HAVING PROFILED DOPING AND WAFERS AND SOLAR CELL COMPONENTS HAVING A PROFILED FIELD, SUCH AS DRIFT AND BACK SURFACE, inventors Ralf Jonczyk, et al., Applicant 1366 Technologies, Inc., of Bedford, Mass., the complete disclosure of which is also hereby incorporated by reference.

A semiconductor wafer can be formed directly from a semiconductor melt, generally using techniques disclosed in U.S. Pat. No. 8,293,009, issued on Oct. 23, 2012, entitled METHODS FOR EFFICIENTLY MAKING THIN SEMICONDUCTOR BODIES FROM MOLTEN MATERIAL FOR SOLAR CELLS AND THE LIKE, by Sachs, et al., which is fully incorporated herein by reference).

Conventional solar collectors are composed of semiconductor wafers that have a relatively thicker portion, in which there are majority carriers, for instance lattice holes, and a much thinner section in which the opposite type of carrier, in that case, electrons, are the majority carriers. The two portions meet at what is called the p/n junction. In an industry standard wafer of 180 microns thick, the p-type potion would be 180 microns thick, and the n-type portion would be about 0.5 micron thick. In such conventional wafers, doping is uniform throughout the thicker portion of the wafer, such as the p-type portion, doped with acceptors (holes) in a p-type wafer, such as a silicon wafer doped with boron. In such a collector, the minority charge carriers are free to move in an essentially random fashion, diffusing randomly from their point of generation (in each portion, but here primary concern is with the thicker portion). Some minority carriers may go toward the p/n-junction collection region, some, in other directions. Such a situation lacks efficiency. It is known that establishing an electric field that would urge the minority charge carriers toward the p/n-junction collection region could, other things being equal increase efficiency. Such an electric field is said to point towards the p/n-junction and would cause generated minority charge carriers to preferentially move toward the collection p/n-junction. This directional preference would increase the collection efficiency of the solar cell. It is believed that this effect cannot be achieved by any conventional melt solidification method used for slicing wafers from thick ingots or bricks. Such a field is sometimes referred to as a drift field.

A known attempt to create such an electric drift field in a wafer established a gradient of doping, which established an electric field pointing towards the collecting p/n-junction. This known work is described in PCT patent application no PCT/NL2005/000422, published as WO2005122287A1, entitled, Method for the production of crystalline silicon foils. This patent application was assigned to Stichting Energie, and the work is referred to below as the Stichting work. The Stichting work had significant negative effects. The main semiconductor material was silicon, and the dopant was gallium. A profile of doping level was created by rapid cooling of a molten body, where the initial rapid cooling resulted in impaired segregation at the initially solidified surface and as the cooling slowed, the gallium would preferentially segregate away from the subsequently later solidified surface, due to gallium's significant equilibrium segregation coefficient (approximately 0.008). Impaired segregation implies that the cooling happens sufficiently fast such that the actual segregation coefficient of the gallium impurity is more than 10 times higher than the equilibrium segregation coefficient. A segregation coefficient of 1 signifies no preference of segregation between liquid and solid phases, representing the maximum value for segregation coefficient. For a weakly segregating dopant such as boron, which as an equilibrium coefficient of 0.8, the maximum increase from the impairment mechanism would be only 1.25 times.

A necessary consequence of this rapid cooling is not mentioned in the Stichting patent application, but it is evident to a skilled practitioner. Metallic impurities within the molten material would necessarily also be incorporated into the solid of the initially rapidly cooled and solidified semiconductor crystal to a large and unacceptable degree. The Stichting work method takes advantage of the relatively significant, (numerically very small), segregation coefficient of gallium to achieve the gradient in concentration. But the metallic impurities also have a relatively significant (numerically very small) segregation coefficients, and for the gallium to be present to a degree sufficient to provide a useable doping profile, it would also necessarily be that any metallic impurities would also be present in the solidified crystal to a high, and thus, unacceptable degree. Thus, although a doping profile would be created by the Stichting method, any formed body would not be practically useful for solar collection, having impurities to a degree of at least one order of magnitude higher metal content relative to equilibrium segregation.

Stated slightly differently, to achieve a 10 times difference (an order of magnitude) in doping from one portion of a wafer to another, the Stichting method would inherently have this same factor, i.e., 10 times more metal in the region of higher doping, than would be present in the region of lower doping. Practitioners in the art understand that such high metal content (and also such varied metal content (or other impurities)) has serious deleterious effects. For instance, the minority carrier lifetimes would be lower than it otherwise would be in the absence of these impurities. Such lower lifetime results in a cell that performs less well than one with higher lifetimes.

A hypothetical but reasonable case illustrates the problems. Consider a case where there is 1 ppm of metal in the melt, with an equilibrium segregation coefficient of $k=10^{-6}$, for example iron (Fe). With the Stichting method, this would result in $5\times10^{11}$ atoms/cm$^3$ of metal in the wafer. This would result in minority carrier lifetime of about 7 microseconds, which leads to 16.4% efficiency.

Another sort of field imposed upon wafers used in known solar collectors is called a back surface field (BSF). Conventional cells often have a back surface field. This field lowers effective back-surface recombination velocity and improves collection probability of minority carriers. A typical way to achieve this is to provide a thin layer of aluminum or aluminum alloy on the back surface during processing. The application of aluminum has drawbacks. First, it is a separate step in the processing, thereby adding a complication that would be absent if no such aluminum layer were required. Second, aluminum is a rather poor reflector of long wavelength light. Thus, when an aluminum back surface layer is present, a relatively high amount of such long wavelength light is not reflected, and is lost. It would be beneficial to be able to reflect and thus capture some or all of such long wavelength light. (As a point of clarification, it should be noted that the BSF discussion entails the repulsion, or reflection of two totally different entities-minority carriers are urged away from the back surface by the BSF. Certain photons are not adequately reflected from the back surface, because they are absorbed or at least, not reflected, by the aluminum layer that gives rise to the BSF.)

Thus, there is a need for semiconductor wafers that have a means for establishing an electric field in a direction to urge the minority charge carriers (principally in the thicker portion of the wafer) to the collection p/n junction. There is a further need for such wafers that have excellent electrical properties and acceptably low levels of impurities. There is also a need for such wafers doped by dopants that do not have a significant segregation coefficient. There is also a need for such dopant-profiled wafers of p-type semiconductor, and also of n-type semiconductor. There is further a need for a method of fabricating such wafers. There is also a need for solar collectors and solar panels incorporating such wafers.

There is also a need for wafers for use in solar cells in which a BSF can be established without requiring a processing step dedicated to that purpose, and also without requiring a layer of optically poorly reflective aluminum at the back surface. There is a further need for such a wafer that can be constructed to enable reflection of a relatively high amount of long wave-length light and thus its capture within the wafer and cell.

Thus, objects of inventions hereof include, semiconductor wafers that have a means for establishing an electric field in a direction to urge the minority charge carriers to the collection p/n junction. A further object includes such wafers with excellent electrical properties and relatively low levels of impurities. Another object are such wafers doped by dopants that do not have a significant segregation coefficient. Yet another object includes such dopant profiled wafers of p-type semiconductor, and also of n-type semiconductor. Still another object is a wafer having a BSF, which has no aluminum back surface. Still other objects are methods of making any and all such wafers. Still another object is a solar cell incorporating wafers having such drift fields or BSF or both. Yet another object is a solar cell that has higher efficiency for collecting long wave-length light, than do cells with aluminum BSF planes.

These objects and others are achieved by inventions hereof, which are shown more fully in the several Figures of the Drawing, which are:

SUMMARY

Figure 1A:
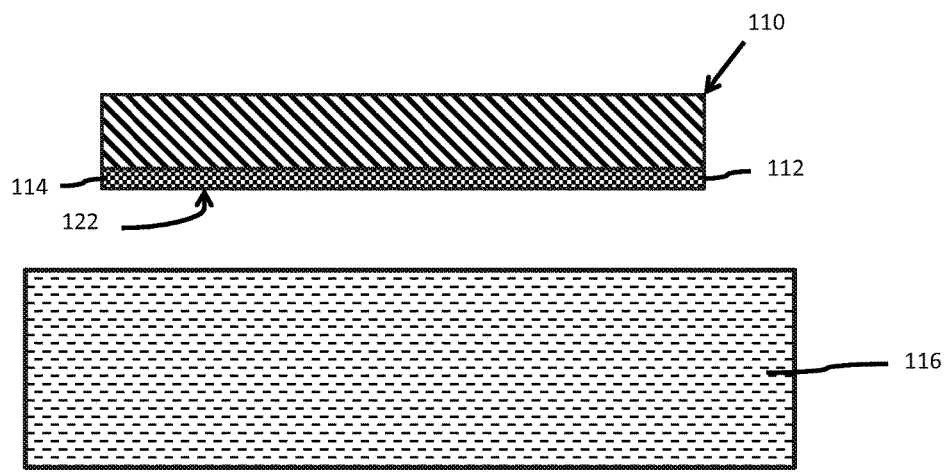
FIG. 1A, which shows, schematically, in cross-section, a mold that is treated with a doping agent approaching a melt of semiconductor material.

A wafer is formed on a mold, which is in some manner provided with a dopant. For instance, the mold can have a coating that contains a dopant. To create a p-type wafer using silicon, a dopant can be boron, which provides extra electron acceptors. When the mold heats up, the dopant enters the melt (by several possible modalities), thereby doping a region of the melt directly adjacent the mold, so that in that adjacent region, the concentration of the dopant (such as boron), is relatively higher, as compared to the concentration of dopant in the bulk of the melt. Within a very short time a semiconductor wafer starts solidifying on the surface of the mold. The dopant, such as boron, does not significantly diffuse in solid silicon. Thus, after a solid wafer is formed, the dopant can no longer enter the melt from the mold, because, solid silicon on the mold surface acts as a boron dopant diffusion barrier. At that time and afterwards, the concentration of boron dopant in the region of the melt adjacent the growing surface of the wafer will be less than the concentration that was present in the region of the melt where the wafer first began to form. As the wafer continues to grow, the new, additional regions of the wafer are formed from a new growth region of the melt, which has a boron dopant concentration, which, over time, becomes continuously less and less. This continuing diminishment of dopant in each successive new growth region establishes a concentration gradient or profile of boron dopant, with a higher concentration being present at the wafer adjacent the mold, which had solidified first, and a lower concentration of boron at the melt side of the solidified wafer, which solidified last. The gradient can be tailored by various means. A gradient in doping would give rise to an electric field that points in a specific direction, and whose strength at any location is related to the degree of gradient at that location and adjacent locations. Such an electric field can have an influence on minority charge carriers in a wafer used for a solar collector.

One gradient concentration profile can be useful to create a drift field within the wafer. Another profile can be useful to create a back surface field within the wafer. Wafers of inventions hereof can be used in solar cells. Higher efficiency is promoted due to the drift field, which promotes the collection of carriers within the cell. Higher efficiency also arises due to the provision of better reflectors on the back surface, made possible by the intrinsic back surface field arising from the doping profile, which enables elimination of industry standard poor reflectors of Aluminum alloy back surface elements.

A characteristic that relates to local doping concentration in a deterministic manner is local resistivity. A gradient in resistivity is also present, and by measuring the resistivity at different locations, the concentration can be determined. Thus, an equivalent way of thinking about and analyzing a gradient in dopant concentration and thus a generated gradient of electric field is to consider the profile of resistivity, from one surface of a wafer to the other.

Method inventions include methods of making one such wafer from a melt. Method inventions also include making a plurality of such wafers from the same melt, including steps to compensate within the melt for accumulation of primary dopant within the melt that would otherwise be too high to use for wafers to be made at a target net dopant concentration to achieve target bulk resistivity for use in solar cells. Compensation is achieved by providing the melt with a compensating dopant of the opposite acceptor/donor type (for instance, to compensate for the acceptor dopant of boron, a donor dopant of phosphorous can be used), periodically as more and more wafers are formed. In some cases, the compensating dopant might segregate disproportionately to the grain boundaries, which could be disadvantageous. In such cases, a method invention hereof is to add a counter compensating dopant (in the case of the boron (acceptor) and phosphorous (donor) system, a counter compensating dopant would be an acceptor, such as gallium, with a suitably significant segregation constant, to minimize the electrical effects of the concentration of the compensating dopant at the grain boundaries.

DESCRIPTION

As is discussed above, a typical semiconductor wafer for use with a solar collector has a relatively thicker portion, in which the majority carriers are of one donor/acceptor type, for instance typically p-type. Such wafers are formed, and subsequently treated so that one face is doped to have majority carriers of the opposite donor/acceptor type, thus, n-type, in the case of a principally p-type wafer. For a typical wafer the first portion would be essentially the full thickness of 180 microns, and the other type portion would be only about 0.5 micron thick. The junction between the two portions is known as the p/n junction. The following discussion deals primarily with a new method to make the relatively thicker portion, which is typically a p-type portion. The methods discussed below would typically be used to create such a wafer. The p/n junction and opposite carrier type portion would be created on one surface after conducting the method steps discussed herein. These methods could also be used to create a thick, primarily n-type wafer. In such a wafer of an invention hereof, there will be a gradient profile of doping from one face of the grown wafer to the other. This doping gradient profile will give rise to an electric field in the finished grown wafer, which field can act as a drift field, and also or alternatively as a back surface field (BSF).

Figure 1B:
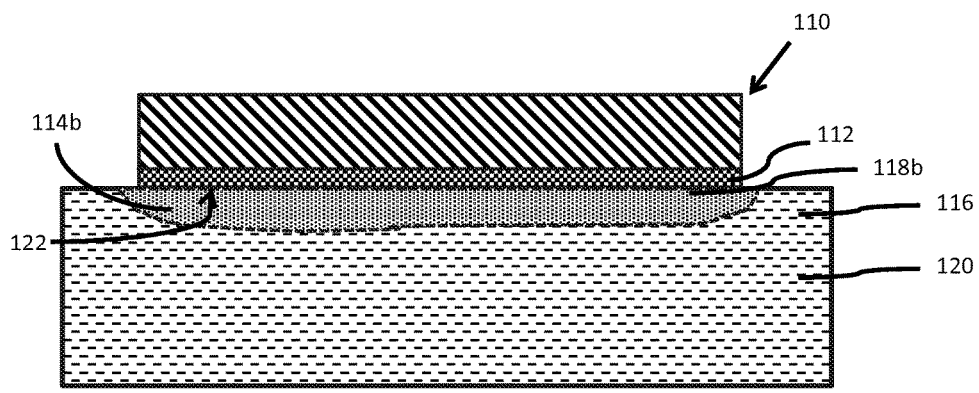
FIG. 1B, which shows, schematically, in cross-section, the treated mold of FIG. 1A contacting the melt, with the upper portion of the melt having some of the treating material entering the melt.
Figure 1C:
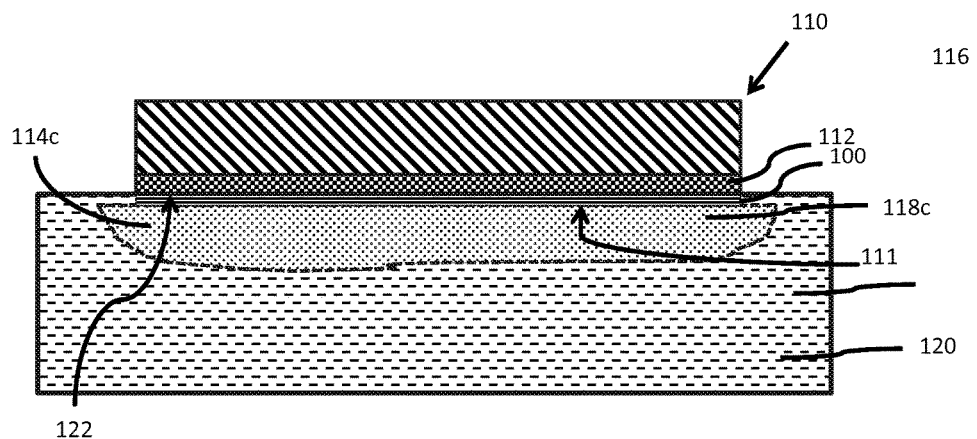
FIG. 1C, which shows, schematically, in cross-section, the treated mold of FIG. 1B still contacting the melt, with a wafer solidifying upon the mold, and with a larger portion of the melt than that shown in FIG. 1B having some of the treating material entering the larger portion of the melt.
Figure 1D:
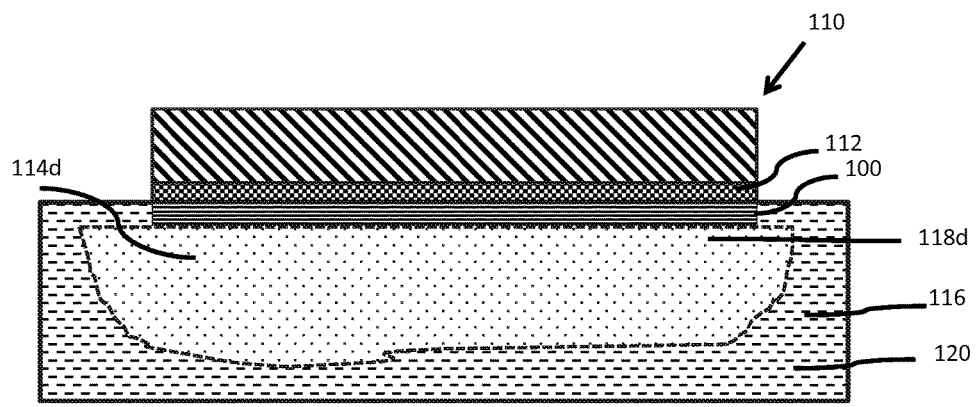
FIG. 1D, which shows, schematically, in cross-section, the treated mold of FIG. 1C still contacting the melt, with a thicker amount of wafer solidifying upon the mold, and with an even larger portion of the melt than that shown in FIG. 1C having some of the treating material entering the larger portion of the melt.
Figure 2A:
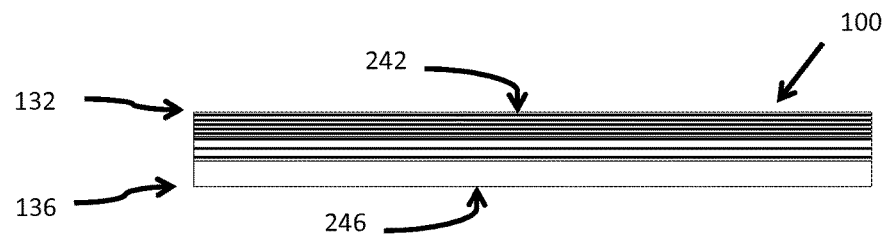
FIG. 2A, which shows schematically in cross-section, a wafer formed upon the mold as shown in FIG. 1D, with a gradient profile of doping.

FIGS. 1A, 1B, 1C and 1D show a mold 110 (also sometimes called a substrate), which is in some manner provided with a dopant, upon which will be formed a wafer 100 (FIG. 2A). For instance, the mold 110 can have a coating 112 that contains a dopant 114. To create a p-type wafer using molten silicon, the dopant can be boron (which is a charge carrier acceptor). An alternate embodiment, shown schematically in FIG. 3 has a mold 310 with a dopant 314 distributed either evenly or in some other mode throughout its body. Several different embodiments of mold dopant treatment are discussed below. The principal typical use for inventions hereof would be with p-type semiconductor wafers and thus, acceptor dopants. Thus, the discussion will focus primarily on such combinations. However, inventions hereof also may be used with n-type semiconductors, and charge carrier donor dopants. (An example of such a system would be a phosphorous-doped substrate, with boron melt compensation.) Yet another, more involved combination is also possible, and is discussed below.

The primary dopant, such as boron, can be anywhere on the surface of such a mold 110, or within the body of such a mold 310. However, it is believed that if it is present in a region of the mold nearest the melt, such as a coating 112 or a region within the body 310 immediately adjacent the surface, that this provides the most advantage, as discussed below. Many different semiconductors can be used as the primary melt component. Silicon is very commonly used, and will be used as a representative example in the following discussion. Likewise, other dopants are possible. Boron will be used as a representative dopant example in the following discussion. The generality of this disclosure is not, however, intended to be limited to silicon as the semiconductor, or boron as the dopant. All reasonable alternatives are considered as aspects of inventions hereof. For instance, for Silicon as the semiconductor, examples of dopants include, but are not limited to: boron (B), aluminum (Al), gallium (Ga) and indium (In). For n-type wafers, dopants include but are not limited to: Phosphorous (P), Arsenic (As), lead (Sb) and Bismuth (Bi).

When the mold 110 heats up, such as when it contacts the hot semiconductor melt 116, for instance of molten silicon, the dopant, such as boron 314 within the mold (FIG. 3) or boron 114 of the mold coating 112 enters the melt 116, thereby doping a region 118b of the melt 116 directly adjacent the mold 110, so that adjacent the mold, the concentration of the boron 114b, is relatively higher, as compared to the concentration of boron in the bulk (remaining regions) 120 of the melt 116. An embodiment as shown in FIGS. 1A, 1B, 1C and 1D, using a coating 112, will be discussed first. As shown in FIG. 1C, within a very short time (e.g., a few milliseconds to several seconds) a semiconductor (e.g. silicon) wafer 100, starts solidifying on the surface 122 of the mold 110.

The mold could be heated other ways (for instance it can be pre-heated before contacting the melt). It is typically advantageous that the mold be cooler than the melt when it touches the liquid silicon to best allow extraction of heat and therefore solidification of the molten silicon. This solidification process will heat up the mold from its starting temperature.

Boron does not significantly diffuse in solid silicon. Thus, as shown in FIG. 1C, after a solid wafer 100 is formed, the boron 114 can no longer enter the melt 116 from the mold/substrate 110, because, solid silicon 100 has formed on the mold surface 122 and the solid silicon acts as a boron diffusion barrier. (This is also typically the case with other dopants and semiconductor wafer systems discussed herein.) Typically, a thickness of a few microns of solid material is sufficient to prevent further diffusion. This thickness may appear initially at spaced apart locations on the mold surface, but relatively quickly, the solidified thickness everywhere on the mold is sufficient to prevent further diffusion. At that time, the concentration of boron 114c in the region 118c of the melt 116 adjacent the growing surface 111 of the wafer 100 will be less than the concentration 114b that was present in the region 118b where the wafer 100 first began to form, immediately after the mold surface 122 contacted the melt 116, as shown in FIG. 1B, because boron 114c atoms have diffused and moved by convection away from the mold 110 and the growing wafer 100 and away from the region 118c adjacent the mold 110 and the growing surface 111 of the wafer 100, into the melt 116.

As the wafer 100 continues to grow (i.e., to thicken) during a time scale of the next few seconds, the new, additional regions of the forming wafer 100 are formed at the surface 111, from a new growth region 118c, 18d of the melt adjacent the growing surface 111, which new growth region 118d has a boron concentration 114d which, over time, becomes continuously less and less. For each successive quantity of growing wafer, the new growth region 118, is ever so slightly progressively further away from the mold, the original source of the dopant. The dopant has rapidly diffused into the bulk 120 of the melt 116, distant from the mold 110.

FIG. 2A, shows the grown silicon wafer 100. The continuing diminishment of dopant in each successive new growth region 118 establishes a gradient of dopant boron in the grown wafer 100, as shown in FIG. 2A, with a higher concentration of boron being present at the portion 132 of the wafer that was adjacent the mold 110 and its surface 122 when the wafer completed its formation, which surface 132 had solidified first, from the region 118 of the melt 116, when it had a relatively higher concentration of boron. There is a lower concentration of boron at the surface 136 of the solidified wafer 100, which solidified last, from the region 118 of the melt (relatively distant from the mold surface 122, with the boron content at that location) at a time when and a location where the melt had a relatively lower concentration of boron.

The foregoing discussion is cast in terms of successive regions of grown wafer 100 and successive new growth regions 118 of the melt, as if these growth regions are discrete, layer-wise, such as sheets of paper. In actuality, the growing of the wafer is continuous, atom-by-atom, and the diffusion of the dopant into the melt is also continuous, atom-by-atom. The amount of dopant that is incorporated into the growing wafer depends on the relative rates of diffusion of dopant into the melt, away from and out of the continuously successive new growth regions of the melt, and the rate of growth of the semiconductor wafer. These two rates are affected by the diffusion propensities of the dopant in the melt, the temperature, the crystal growth speeds, etc. Thus, the concentration of boron in the wafer varies smoothly, from the surface 132, which formed nearest the mold, to the surface 136, which formed more distantly from the mold, deeper within the melt. (FIG. 2A shows three different regions of the formed wafer, with three different, discrete concentrations of dopant, concentration being indicated by closeness of the horizontal hatching lines, closer hatching indicating greater dopant concentration. This is not meant to realistically represent the formed wafer, but is merely a limitation of the drawings, which must show in black and white a physical situation that might better be shown in a segue of grey scales from the surface 132, which formed adjacent to the mold, to the surface 136, which formed more distant from the mold.)

Figure 5:
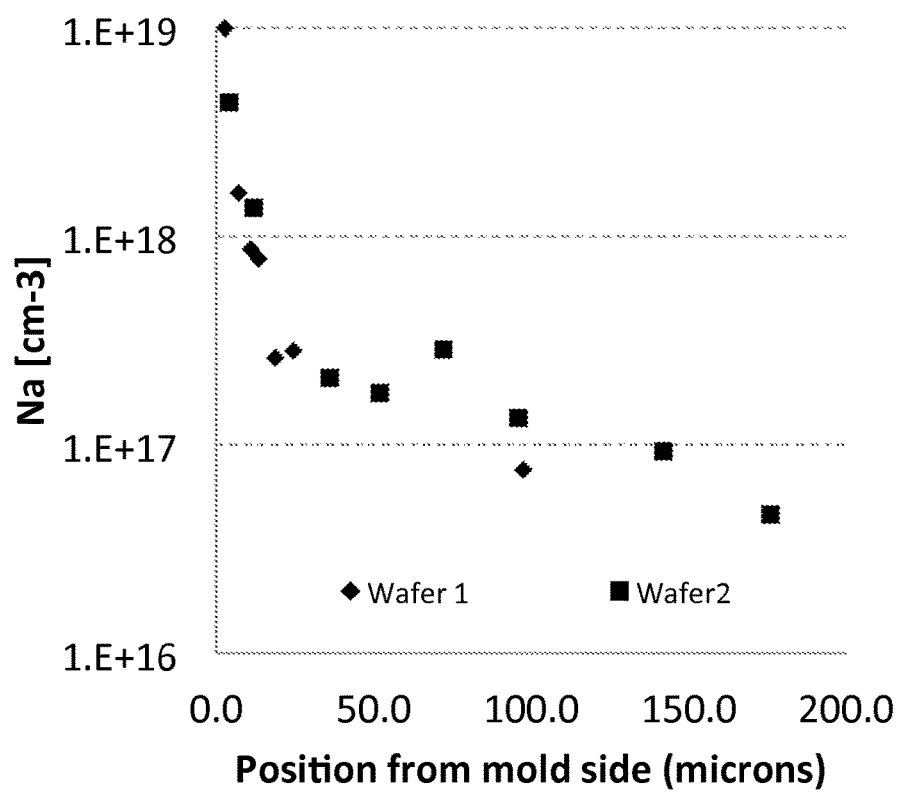
FIG. 5, which shows, in graphical form, a relationship between the number of acceptors (Na/cm$^3$) and position from the mold side, of representative wafers made according to inventions hereof.

FIG. 5 shows the p-type doping concentration for two different wafers (designated wafer 1 and wafer 2), each showing a concentration of about $1 \times 10^{19}$ $N_a/cm^3$ at the portion of the wafer that formed first, immediately adjacent the mold, descending in a smooth curve with a roughly exponential decay shape, with $N_a/cm^3$ concentrations of between about $1 \times 10^{17}$ and $1.5 \times 10^{17}$ over a range of positions from about 25 to about 150 microns from the portion of the wafer that formed first, immediately adjacent the mold. $N_a$ as high as $1 \times 10^{20}$ $N_a/cm^3$ are believed to be possible, and also at the location of the wafer that formed last, farthest from the mold, it is believed that concentrations as low as low as $1 \times 10^{15}$ $N_a/cm^3$ are possible. The unit $N_a$ stands for the number of acceptors, as in electron acceptors. For an n-type dopant, a corresponding unit would be $N_d$, which stands for the number of donors, as in electron donors. (In some cases below, and in the claims, the expression $N_x$, is used to denote either $N_a$ or $N_d$, as the case may be, depending on whether electron donors or acceptors are intended.) As can be seen, the transition from relatively higher concentration to relatively lower concentration is smooth and continuous.

Semiconductor wafers having such a doping gradient are not known to have been produced before, other than in the very limited type mentioned above, using the Stichting method. As discussed above, that method created semiconductors having very poor electrical properties.

Recalling the hypothetical example outlined above regarding impurities and the Sticting method, having a factor of ten difference in doping, and thus the same difference in impurities, and $5 \times 10^{11}$ atoms/cm$^3$ of metal in the wafer, resulting in a minority carrier lifetime of about 7 microsecond, leading to a 16.4% efficiency, wafers made according to inventions hereof would have significantly better properties. Such a wafer would have $5\times10^{10}$ atoms/$cm^3$ of metal in the wafer, resulting in a minority carrier lifetime of about 70 microseconds, leading to an 18.4% efficiency. This example is hypothetical, and other factors will enter into any actual physical case, but the comparison is apt.

Figure 2B:
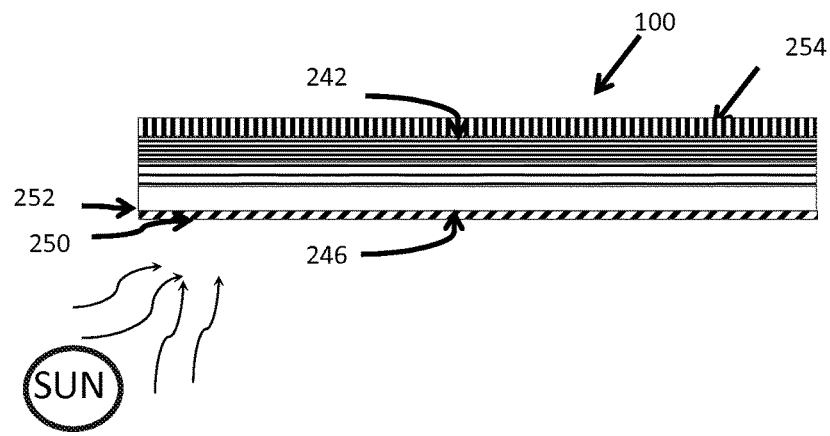
FIG. 2B, which shows schematically in cross-section, the wafer of FIG. 2A after a doping of n-type material has been added to one side, thereby forming a p/n junction, and a region of higher doping has been formed on the opposite side from the n-type material, which will give rise to a BSF.

In a dopant profiled wafer of an invention hereof, if formed from a melt doped with p-type material, the wafer is first formed, and then the opposite type material, in this case n-type, will be created on one surface, thereby creating a p/n junction. FIG. 2B shows, schematically, the relationship between the p/n junction and the doping profile of an invention hereof. For a p-type wafer formed from a melt as discussed above, with a doping profile, the p-side of the wafer 100 (the more positively doped side) will be the side 242, with the higher p-type dopant of boron concentration, which formed closer to the mold surface 122. The n-side of the wafer (the less positively doped side, or, the more negative side) will be formed on the side 246, with an initially lower p-type dopant boron concentration, which formed more distant from the mold surface 122. Formation of the n-type (or oppositely doped) portion 250 can be done by any conventional, or yet to be developed method. Typically, the depth of such a section would be only about 0.5 micron thick. In a typical application, the boron p-type doping provides $N_a$ of about $1\times10^{16}/cm^3$. The n-type doping provides $N_d$ of approximately $1\times10^{19}/cm^3$. Thus, at the side 246, the n-type doping predominates. The p/n junction 252 is between the n-type portion 250 and the side 246 with an initially lower p-type dopant concentration. The sun-facing side of this wafer would have the n-type portion 250 facing the sun. A back surface field portion 254 (discussed in more detail below) is also shown, which is adjacent the side 242 having initially higher p-type dopant concentration, on the side opposite from where the sun would be.

As discussed above, such a dopant gradient is beneficial because it establishes an electric field pointing towards the collecting p/n-junction with regard to the minority carriers. The electric field causes generated minority charge carriers to preferentially move toward the p/n-junction. This directional preference increases the collection efficiency of the solar cell. It is believed that this effect cannot be achieved by any conventional melt doping method. (In a p-type semiconductor, the minority carriers are electrons).

It should be noted that considering the dopant concentration at different locations within the body of the wafer is only one way to describe its structure and properties. Another way is to consider the resistivity of the material at the same different locations throughout its body. It is also true that, due to the different net doping concentration, there will be a corresponding and related difference in the resistivity of the wafer at different locations throughout the body. Thus, there is also a gradient in resistivity of the body, which gradient is generally inverse that of the net doping gradient. By that, it is meant that resistivity is higher in regions of lower dopant concentration, and it is lower in regions of higher dopant concentration. It is also to be noted that although these gradients in concentration and resistivity are generated by the phenomena described above of melt solidification and segregation, it is relatively difficult to measure material concentrations at different locations within a wafer. However, it is much easier to measure resistivity at such locations through the body. (This can be done by measuring the resistivity of a body, removing a layer of material, and measuring the resistivity of the remaining body, whereby it is possible to determine, from the difference, the resistivity of the portion that has been removed.) From this determined resistivity, it is also possible to determine the material concentration, i.e., the doping concentration, of the layer that has been removed. Layer by layer, the resistivity profile, and thus also the doping concentration profile through the entire body, can be measured and thus determined.

The relationship between resistivity and dopant, or carrier concentration is deterministic and non-linear. Table 1 below shows a representative set of values relating resistivity (ohm-cm) on the one hand to acceptor carrier concentration (atoms/$c^3$) and also to donor carrier concentration.

TABLE 1

RELATION BETWEEN RESISTIVITY AND CARRIER CONCENTRATION

| Resistivity (ohm-cm) | Acceptor Conc. (atoms/$cc^3$) P-type dopant | Donor Conc. (atoms/$cc^3$) N-type dopant |
|---|---|---|
| 0.001 | $1.15 \times 10^{20}$ | $7.36 \times 10^{19}$ |
| 0.01 | $7.98 \times 10^{18}$ | $4.38 \times 10^{18}$ |
| 0.1 | $2.40 \times 10^{17}$ | $7.77 \times 10^{16}$ |
| 0.3 | $5.83 \times 10^{16}$ | $1.87 \times 10^{16}$ |
| 0.5 | $3.19 \times 10^{16}$ | $1.04 \times 10^{16}$ |
| 1 | $1.47 \times 10^{16}$ | $4.83 \times 10^{15}$ |
| 2 | $6.97 \times 10^{15}$ | $2.31 \times 10^{15}$ |
| 4 | $3.38 \times 10^{15}$ | $1.13 \times 10^{15}$ |
| 6 | $2.23 \times 10^{15}$ | $7.43 \times 10^{14}$ |
| 10 | $1.32 \times 10^{15}$ | $4.41 \times 10^{14}$ |

The relationship can also be characterized graphically, such as in a log-log plot. Such a graph is shown at www-.solecon.com/pdf/converting_resitivity_to_carrier_concentration_graph_sige.pdf. This is a website showing work of Solecon Laboratories of Trademark Dr., Reno, Nev. The graph shown there is hereby incorporated fully herein by reference. The vertical scale denotes carrier concentration/$cm^3$, with the horizontal scale denoting resistivity (ohm-cm). The relationship between carrier concentration and resistivity shows generally higher concentration correlates with lower resistivity, and vice-versa. On the log-log scale, the slope is generally negative. Graphs for n-type and p-type doping of the same semiconductor, for instance, germanium, are generally congruent and spaced apart, with that of p-type being displaced toward the right, generally such that in the p-type semiconductor, there will be higher resistivity for the same carrier concentration in an n-type semiconductor. The relationship between carrier concentration and resistivity for silicon semiconductors is generally the same as described for the germanium semiconductor. The values were determined using Spreading Resistance Analysis (SRA). The authors explain that to calculate carrier concentration values for silicon, they used mobility values derived from Thurber, Mattis, Liu, and Filliben, National Bureau of Standards Special Publication 400-64, *The Relationship Between Resistivity and Dopant Density for Phosphorus-and Boron-Doped Silicon* (May 1981), Table 10, Page 34 and Table 14, Page 40. To calculate germanium carrier concentration values, they used carrier mobility values derived from D. B. Cuttriss, Bell System Technical Journal (March 1961), p. 509.

The process described above works very well without modification for creating one, or a small number of wafers from a single melt without adjusting the melt composition.

One challenge presented by this process is that without modification, it will result, over time, as more and more wafers are made, in an increase in the concentration of the dopant, such as boron, in the melt. That is because less than all of the boron that had moved from the mold during the time of the production of a single wafer, will be incorporated into the wafer being formed during that time interval. This concentration build-up in the melt limits the number of wafers that can be grown, before the melt becomes too rich in dopant, e.g., boron, for the baseline doping level. To be precise, the melt has become too rich in whatever it is that the dopant provides, either electron donors or acceptors. Eventually, equilibrium is reached, at which point, the amount of boron removed from the melt with the formation of each wafer is equal to the amount of boron added from the mold to the melt with each wafer growth cycle. The boron concentration at which this equilibrium is reached is typically too high to make a quality conventional solar cell wafer from the dopant rich melt.

To compensate for such a buildup of boron in the melt, an amount (specified below) of a different material, referred to herein as a compensating dopant, for instance in the case of a boron primary dopant, a compensating dopant of phosphorous can be added directly to the melt. (As explained below, there is reason in some cases for yet another compensating dopant (for different reasons), and so, in some cases, this compensating dopant about to be described may be referred to as a first compensating dopant.)

Boron is a member of Group III of the periodic table of elements, and has a propensity to accept, or to receive one electron. Thus, boron is an electron acceptor. Phosphorous is a member of Group V of the periodic table of elements, and thus, it has an excess electron that can be donated to the melt. Thus, phosphorous is an electron donor. Thus, Phosphorous compensates for the excess electron acceptors of boron, because phosphorous provides the electrons that the excess boron tends to accept, thus compensating for the excessive boron acceptors. A single atom of phosphorous donates a single electron, and a single atom of boron accepts a single electron.

Phosphorous added in the proper amount will compensate for excess boron and maintain the wafer formation process indefinitely at desirable boron dopant levels. The amount (as measured by the number of atoms) of phosphorous (compensating, donor dopant) to compensate is approximately equal to the amount (as measured by the number of atoms) of boron (excess, primary, accepting dopant) in the melt, multiplied with the segregation coefficient k of boron and divided with the segregation coefficient of phosphorous (specifically k=0.8 for boron and k=0.3 for phosphorous).

Stated differently, melt doping (the concentration of acceptors, or donors, as the case may be, depending on whether a p-type or n-type semiconductor) should ideally be kept at or close to conditions under which a wafer grown on a mold with no doping material contained in any part of the mold or mold coating will be of high resistivity, such as typically for n-type, greater than 1 Ohm-cm, and for p-type, greater than 2 Ohm-cm. To achieve this, the amount of compensating doping material of the opposite type to the primary type present in the mold or coating, should preferably be present in the melt in a concentration described by the following relation:

$$C_{cd} \text{ approximately equals } C_{md}*(k_{md}/k_{cd})$$

where:
$C_{md}$ is the melt concentration of the mold primary dopant (boron for example);
$C_{cd}$ is the melt concentration of the compensating-dopant (phosphorous for the above example of a boron primary dopant);
$k_{md}$ is the effective segregation coefficient of the mold primary dopant; and
$k_{cd}$ is the effective segregation coefficient of the compensating dopant.

The resulting wafer will have a measurable gradient in boron concentration (see FIG. 5), from, for instance about $1\times10^{19}$ $N_a/cm^3$ to about $1\times10^{17}$ $N_a/cm^3$. Thus, one aspect of an invention disclosed herein is an article of manufacture, which is a wafer that has a measurable gradient in a primary dopant, such as boron, concentration, as measured from one surface to the opposite surface. In fact, a reasonable minimum difference between the doping at the melt side and the doping at the substrate side is factor of three times. This yields a 0.1% increase in efficiency over a flat doping profile containing the same number of acceptors. The size of the gain is dependent on many factors, such as cell architecture, minority carrier lifetime of the wafer, surface passivation, etc. The example above (0.1% gain, front to back doping difference of 1/3, is achieved with a PERC architecture. The gain may be different with an aluminum BSF architecture. As mentioned above, it is difficult to directly measure dopant, such as boron, concentration within the body of the wafer. Thus, by measurable dopant concentration, what is meant is a dopant concentration that can be determined by either measuring dopant concentration directly, either by present or yet to be developed means, or by measuring resistivity, layer by layer, as discussed above, and then from the resistivity, calculating or determining in some other way, such as by reference to a table such as Table 1 or graph, the dopant concentration that correlates with that resistivity, and thus compiling a resistivity gradient profile and also a dopant gradient profile.

The compensating dopant should be added periodically, or continuously, to match the rate of addition of dopant from the mold.

Thus another aspect of an invention disclosed herein is a method of fabricating a wafer, and a more specific aspect of a method invention disclosed herein is a method of fabricating a wafer having a measurable gradient in dopant, such as boron, concentration, or resistivity, as described above, and a particular method invention hereof is a method of producing a plurality of such a wafers from a melt over time, while maintaining relatively similar doping and resistivity profile, even as more and more wafers are made, and more primary dopant enters the melt.

Figure 3:
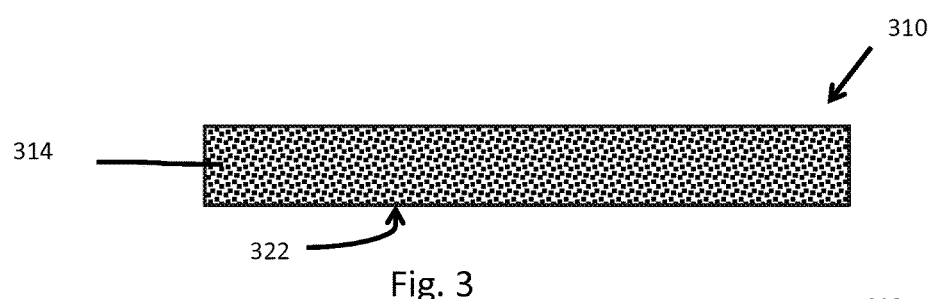
FIG. 3, which shows, schematically, in cross section, a mold of an invention hereof, which is treated with doping material throughout its volume.
Figure 4:
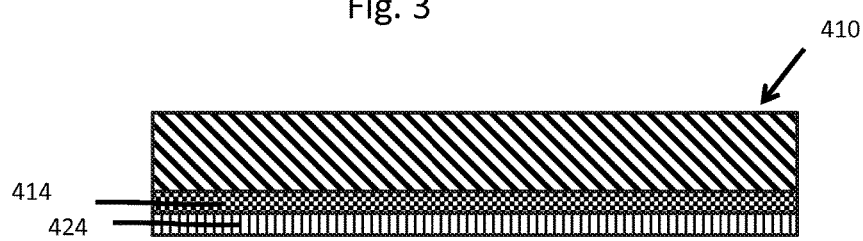
FIG. 4, which shows, schematically, in cross section, a mold of an invention hereof, which is treated with doping material in a pair of layers or coatings on and near one surface.

Turning now to a discussion of the location of the dopant source that will be incorporated into the wafer, a typical location is shown in FIG. 1A, as a coating on the forming surface 122 of the mold 110, or as shown in FIG. 3 and FIG. 4, somewhere within the body of the mold 110, in a location where, upon heating of the mold, the dopant can move through the body of the mold, to exit the mold and dope the melt 116. Thus, as shown at 114 in FIG. 1A, the dopant 114 may be in an outermost layer 112 of a coating on the mold 110, such as a release layer. Or, as shown in FIG. 3, it may be located within the body 314 of the mold 310, either evenly distributed, or in more concentrated regions, such as more concentrated closer to the forming surface 322. Or, as shown in FIG. 4, it may be located in a submerged layer 414 of a coating on the mold, with another layer, 424, such as a release layer, at the surface.

More specifically, the mold 310 itself, can contain volatile boron-containing compounds 314, such as: boron oxide, boron nitride, boron, boric acid and boro-silicate glass. Alternatively, or in addition, the mold coating 112 that is in immediate contact with the melt can contain volatile boron compounds and boron compounds soluble in silicon (in the case of a silicon wafer being formed, otherwise, soluble in the semiconductor being formed) including: boron oxide, boron nitride, boron, boric acid, boro-silicate glass, boron carbide, boron silicide. Yet further in alternative, or in addition, the mold coating region 414 that is not in immediate contact with the melt can contain volatile boron compounds, including: boron oxide, boron nitride, boron, boric acid, boro-silicate glass.

Another matter to consider, related to the location of the dopant, is the modality by which it passes or migrates from the mold to the molten material. It is believed that three different major possible modalities exist. One would be dissolution of dopant into the molten silicon, followed by diffusion further into the melt. This dissolution and diffusion modality is believed to confer many benefits. A second would be diffusion from the mold into the liquid of the melt. The third, and presently least preferred, is vaporization from the mold to the melt.

Turning to each of these in turn, the most preferred would be where the dopant from the mold, such as in the form of $B_4C$ (boron carbide) or $B_4Si$ (boron silicide) would dissolve from the mold, such as from the coating, into the melt. Within the melt, the dopant would decompose into its constituents, and the dopant, such as boron, would diffuse further into the body of molten material. The other components, such as C or Si, to the extent the melt were not already saturated with them, such as is likely the case, would diffuse also. Advantages that follow from this modality are that each wafer made on the same mold receives the same amount of dopant, unlike other modalities, such as the third mentioned below, where more dopant is released for the earlier wafers made.

The second modality, in which the dopant diffuses directly into the liquid from the mold, would diffuse from a coating, or from the mold itself into the melt, is thought to be least likely because most, if not all materials would enter the melt by some mode other than diffusion only, such as by dissolution or vaporization. In any case, for all modes in which dopant is in actual contact with the melt, diffusion will take place to some degree.

The third modality, direct vaporization, is not preferred. For example, $B_2O_3$ (boron Oxide) or BN (boron nitride) might be heated to a degree that it vaporizes directly from its location on the mold (e.g. in a coating) or in the mold, to pass directly into the molten semiconductor material as a gas. This is not preferred because it is expected to be difficult to control the degree to which the dopant is released into the melt. The entire source for dopant gets hot all at once, and will release boron by vaporization, not just the portion of dopant source in contact with the melt. Thus, the first time the mold is heated, more dopant will be released, for instance small particles could disappear after just one heat cycle. Or the process is limited by diffusion to the surface of the mold of the dopant particles.

Relating to both the location of the dopant, and the modality, some examples are instructive. For doping from a coating of the mold, such as a release coating, that contacts the melt directly, such as shown in FIG. 4 at layer 424, or FIG. 1B, at layer 112, when minimal vapor transport is desired, a suitable dopant source would be a coating material of $Si_3N_4$ or $SiO_2$, and dopant of $B_4C$ or $SiB_4$. For doping from any layer of a mold coating that is not in direct contact with the melt, such as shown in FIG. 4, at layer 414, a suitable dopant source would be a coating material of $Si_3N_4$ or SiC, and dopant of $B_sO_3$ or BN. For doping from the mold, but not a coating, such as shown at 314 in FIG. 3, a suitable mold material would be SiC, and dopant of $B_2O_3$ or BN.

The basic method described above will also work with any other p-type primary dopant instead of Boron (such as Aluminum (Al), Gallium (Ga), Indium (In)) and using any suitable n-type dopant to compensate the melt (Phosphorus (P), Arsenic (As), antimony (Sb), Bismuth (Bi)), respectively. However, the pair of B and P is thought to be extremely advantageous for use with growing silicon wafers, because they have the numerically highest segregation coefficients of all effective dopants in silicon. (An element with a relatively higher segregation coefficient segregates during solidification relatively less than others, and as such, those with the highest segregation coefficient segregate during solidification the least.) Thus, upon solidification, the dopant B and compensating dopant P would be distributed relatively uniformly within the crystal, as compared to the case that would arise if elements were used that had numerically smaller segregation coefficients (with greater propensity to segregate). A similar, but correlative process could also be used to make primarily n-type doped wafers. In that case, the primary dopant provided by the mold or a coating thereon would be an n-type dopant (such as P, As, Sb, Bi) and the melt compensating dopant would be a p-type dopant (such as B, Al, Ga, In).

Table A below shows representative primary dopants and compensating dopants for p-type and n-type semiconductors and their respective segregation coefficients.

TABLE A

Dopants and Equilibrium Segregations Constants

| P-Type | | N-type | |
|---|---|---|---|
| Primary dopant | compensating dopant | Primary dopant | compensating dopant |
| B (0.8) | P (0.3) | P | B |
| Al (.002) | As (0.3) | As | Al |
| Ga (0.008) | Sb (0.023) (antimony) | Sb (antimony) | Ga |
| In (0.004) | Bi (0.0007) | Bi | In |

This method of doping a semiconductor material could be applied to any semiconductor that can be grown from a melt, including Silicon (Si), Germanium, (Ge), Gallium arsenide (GaAs), etc. Growing semiconductor wafers/bodies from semiconductor materials other than silicon would require using different dopants (for example silicon as a primary dopant for GaAs wafers) and different compensating dopant materials.

Table B below shows compounds of doping elements that could be used as source. An x mark means that compound exists, e.g. boron carbide, boron oxide, etc. (In contrast, there are no silicides for P, As, Sb, Bi.) Pure elements could also be used and any compound of Si, C, O, N, could be doped with any of the elements and then used as source for dopant. Some of the compounds listed exist but are not practical, due to low stability, reactivity with moisture, toxicity, etc.

TABLE B compounds of doping elements

| Element | B | Al | Ga | In | P | As | Sb | Bi |
|---|---|---|---|---|---|---|---|---|
| Carbide | x | x | x | x | x | x | x | x |
| Oxide | x | x | x | x | x | x | x | x |
| Nitride | x | x | x | x | x | x | x | |
| Silicide | x | x | x | x | | | | |

Inventions disclosed herein confer many benefits. One is a beneficial electric field that improves minority carrier collection and thus efficiency of a solar cell. Another is higher efficiency at lower resistivity, which implies that a higher fill factor is possible. There are also possible synergies with PERC-like processes (lower resistivity is beneficial for PERC like cell architectures). (PERC stands for Passivated Emitter Rear Contact.)

Yet another benefit relates to the fact that the gradient of dopant (or its correlate, resistivity) can give rise to a passivating field automatically. (This is evidenced by the very high doping concentration in the portion of the wafer that was formed nearest to the mold, as shown on the left hand side of the curve, as shown in FIG. 5.) A passivating field will reduce recombinations at the rear surface. The benefit is that a conventional Aluminum BSF (Back Surface Field), which would conventionally be applied during cell processing, is not necessary, and could be eliminated. This would then reduce the number of steps in the formation of a typical cell.

Another advantage grows from this. If the Al BSF need not be present, then an open grid contact can be used at the back of the wafer, allowing long wavelength light to pass through the cell and be reflected at an efficiently reflective sheet at the module back and then passed back through the cell again. This is discussed in more detail below.

Figure 6A:
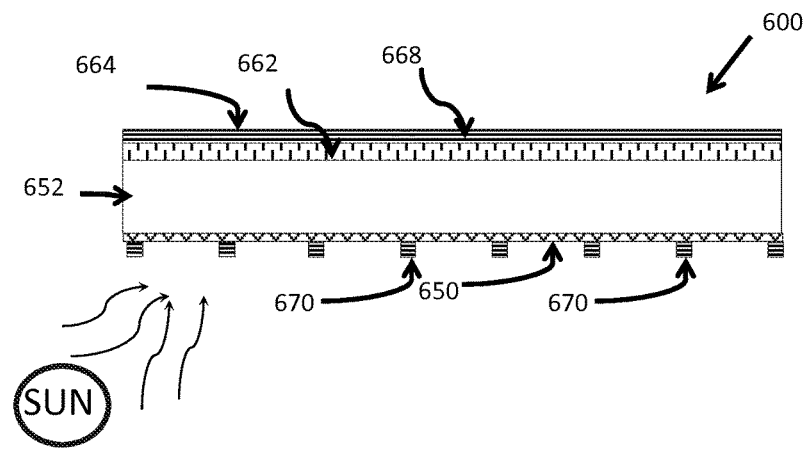
FIG. 6A, which shows, schematically in cross-section, a prior art wafer for use in a solar collector, with an Aluminum alloy back surface electrode.

The gradient of doping (and its correlate, resistivity) through the thickness of the wafer can also provide what is called a Back Surface Field (BSF). FIG. 6A shows schematically in cross-section a known solar cell 600 incorporating a BSF. A BSF is created by a region 662 of particularly high concentration of dopant at the back (surface facing away from the sun) of the solar cell, which creates a strong electric field within the semiconductor material at the back of the cell. This electric field repels the minority carriers that approach the back of the cell and prevents the vast majority of them from reaching the very back surface 664 of the semiconductor material. This is important because if they were to reach this back surface 664, there is a high probability that they would re-combine at this surface and therefore no longer be available to create current in an external circuit.

Drift fields and back surface fields both rely on spatial variation of the doping density through the thickness of the wafer, with a higher doping density toward the back of the cell and a lower doping density toward the front of the cell. However, they differ in several important regards. First, a drift field is most effective when it extends through the thickness of the wafer, because as such, it will keep gently pushing the minority carriers toward the collecting junction (and not let them be subject exclusively to diffusion). Conversely, a BSF is confined to the back portion of a cell wafer. For example, in a cell wafer of 180-200 micron thickness, a BSF region of the cell wafer might be 1-10 microns thick, with a typical thickness of approximately 5 microns. Further, the doping level in a BSF is very high, to create a high electric field, which then effectively repels the minority carriers toward the front. In fact, this doping level is so high that it can negatively impact the minority carrier diffusion length (or lifetime) in this rear portion of the cell. The net impact on the device performance is still very positive, because the reduction in diffusion length is localized only to the very back of the cell and because the BSF itself minimizes the number of carriers that enter this region. In contrast, the lower doping levels in a drift field have relatively little negative impact on the minority carrier diffusion length. Such a BSF cell is shown in FIG. 6A.

The most common way to create a BSF is to screen print aluminum paste onto the back of the wafer and fire it in a belt furnace. This results in a region 662 of silicon with a very high doping density of aluminum—a p-type dopant. In addition there is a layer 668 of aluminum-silicon alloy (much of it at the eutectic composition) behind this. This aluminum alloy region 668 acts as the rear contact/conductor for the cell. Unfortunately, for the operation of such a conventional BSF cell, the aluminum-silicon alloy is not a particularly good optical reflector, having a reflection coefficient of approximately 60%. Thus, 40% of the infra-red light that is not absorbed in its first pass through the cell body 652 is absorbed by this rear contact and is no longer available to travel back through the cell body 652 in a second pass. This limits the current generated by the cell significantly and the voltage a small amount. The sun-facing surface of the cell may be provided with a textured surface 650, and with electrical contact fingers 670.

Figure 6B:
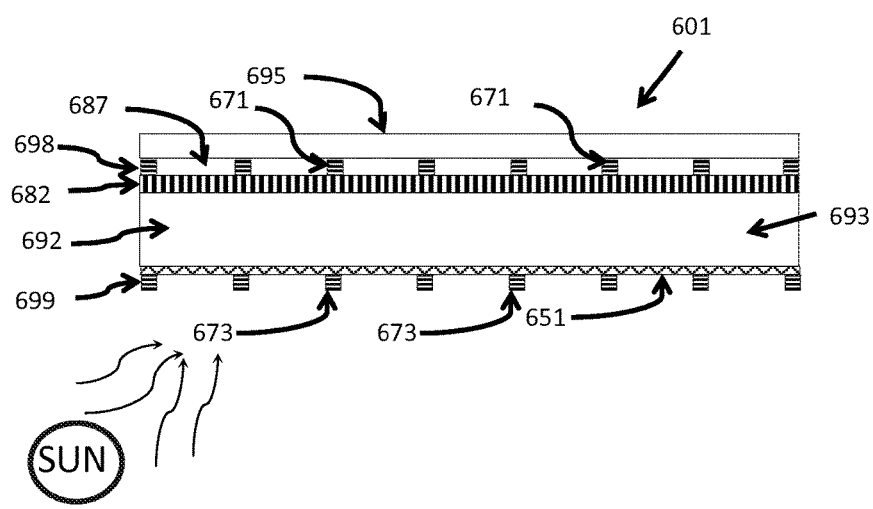
FIG. 6B, which shows, schematically, in cross-section, a wafer of an invention hereof, for use in a solar collector, with a highly doped rear surface due to a doping profile, without an Aluminum alloy back surface electrode, but with an open grid electrode and a high efficiency optical reflector.

As shown in FIG. 6B, the grown-in doping of an invention hereof can provide a region 682 with a doping profile, which functions as a BSF, without the drawbacks mentioned above. In certain embodiments, this region 682 of particularly high doping (for the back surface) can be created together with a more extensive region 692 of profiled drift-field doping through the thickness of the cell wafer. (As shown in FIG. 6B, the region 692 does not have any graphical representation of a doping profile, in order to simplify the figure. However, it should be understood that there can be a gradual or less gradual doping profile similar to that as shown in FIGS. 2A and 2B, discussed above.) In other embodiments, the flux of dopant coming from the mold or mold coating can be designed to be confined more narrowly to the back of the cell wafer. This could then be used to create a significantly doped BSF region 682, and also to create a drift field region 692 that is only very mildly doped, so that although there would be a drift field, it's gradient would be very gradual, or less abrupt. Or, both effects can be achieved with the same doping, or, with different doping patterns.

Several methods exist to create a grown-in doping, which functions as a BSF. A typical BSF would have about $1 \times 10^{18}/cm^3$ acceptors. To achieve this, a large amount of an acceptor dopant, such as boron, would be provided within the mold. To enhance the back side doping, as compared to the front side doping, the semiconductor crystal could be grown relatively slowly, after initial nucleation, which would provide more time for acceptors already in the melt to diffuse deeper into the melt, away from the solidifying crystal, thus allowing a much lower concentration of acceptors (boron) in the majority of the crystal compared to the initial layer grown immediately adjacent to the mold. The strength of the BSF is proportional to the ratio of doping at the back over doping in the bulk of the wafer. In addition, or alternatively, nucleation could be enhanced by providing higher vacuum (or pressure differential), as discussed below, during earlier portions of solidification. This would cause the crystal solidification and growth to start earlier, while the dopant concentration near to the mold in the portion of the melt from which the body will solidify, will form. The technique of varying the vacuum (or differential pressure regime) over time, or in different locations, is described in the above referenced U.S. Pat. No. 8,293,009, by Sachs et al. Wafers have been made with a carrier concentration of $1 \times 10^{18}/cm^3$ acceptors at the surface of the wafer that was formed adjacent the mold face.

The foregoing mentions adjusting vacuum pressure or differential pressure regime during solidification. This refers to a method disclosed in the U.S. Pat. No. 8,293,009. It is beneficial for the mold described therein to be porous (as discussed below). A pressure differential is provided between the surface of the mold that contacts the surface of the molten material, and a back surface of the mold, so that upon contact, molten material is drawn toward the mold face. The porosity of the mold is such that molten material is not drawn into the porosities. This is accomplished by the porosities being small enough so that surface tension and other phenomena prevent the molten material from entering the porosities before the material solidifies. They are also numerous enough so that the pressure differential can be established, despite their small individual sizes. The pressure differential can be established by providing a vacuum, or by providing the surface of the molten material at a pressure above atmospheric pressure, with the opposite surface of the mold at a lesser pressure, so that the pressure differential provides a force that forces the molten material and then the solidified body toward the mold face. By providing this pressure differential, the force of contact between the molten material and the mold face is enhanced as compared to a case with no pressure differential, which provides for more rapid solidification. Enhanced pressure differential can also be provided at individual locations across the mold face, as opposed to other, un-enhanced locations, by various means, such as thermal inserts or voids at specific locations in the mold face. By porous, it is meant a body that is full of very small holes and passageways, such that continuous paths exist for gas to flow from one surface of the mold to the other. The porosities are very small. They are typically micron scale, such as ten microns in diameter, up to perhaps thirty or forty microns diameter. They are numerous, covering the surface of the mold and passing through a large volume of its body. The pathways are tortuous, such as in a natural sponge. As defined herein, porous does not include macroscopic simple holes that pass from one surface to the other, such as holes drilled through the mold body.

FIG. 6B shows a cell wafer 601 with a BSF region 682 and with a rear electrode 698 in the form of fingers 671 similar to the fingers 673 of the front, sun facing electrode 699, which also shows fingers. An optical (typically white) reflector 695 (which may be specular or diffuse) is behind (relative to the sun) the rear electrode 698. This reflector may be the back sheet used during the encapsulation of the module. There can be a physical space 687 between the back of the cell wafer and the reflector or there can be no space. In this way, photons that are not absorbed in their first pass through the main body of silicon 693 will exit the cell wafer, be reflected by the optical reflector 695 and re-enter the cell wafer from the back surface, for a second pass through the silicon body 693 and an additional chance to be absorbed. The optical reflectivity of most of the back contact is in that case governed by the reflectivity of the material 695 placed behind the cell wafer, which can be greater than 90% and in many cases, greater than 95%. The sun-facing surface of the cell wafer may be provided with a textured surface 651 similar to the prior art embodiment shown in FIG. 6A.

Figure 7:
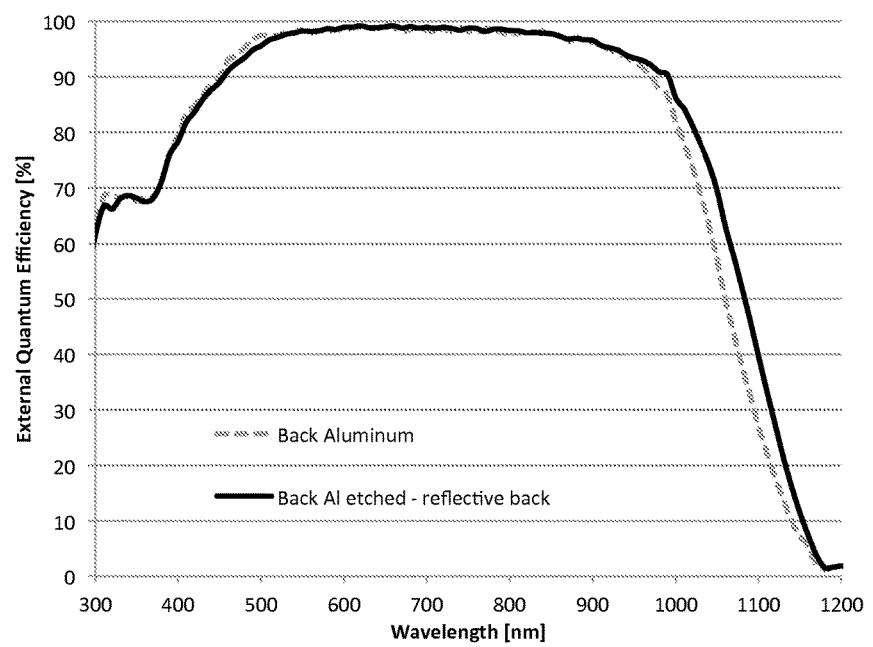
FIG. 7, which shows, in graphical form the relationship between the Quantum Efficiency, as compared to incident light wavelength, for two different configurations, including those shown in FIGS. 6A and 6B.

FIG. 7 shows, graphically, the quantum efficiency (QE) measurements for the two types of cells. The photo-response for the structure shown in FIG. 6A is shown in dashed line and is generally inside of the other curve. The photo-response for the structure of an invention hereof, with a grown-in BSF and reflective back sheet, shown in FIG. 6B, is shown in solid line, and is generally outside of the other curve. Thus, as can be seen, the photo-response of the cell is higher for the structure of an invention hereof, shown in FIG. 6B. The increased QE is in the infra-red region of the spectrum wavelengths on the graph 900 nm-1200 nm, as expected—because it is these longer wavelengths which can penetrate to the back of the cell. The result is a higher efficiency cell.

A basic cell structure of a wafer, and some form of BSF, for instance provided by alloying aluminum during the contact firing step, backed by an open region, a grid-like electrode, and a reflector is known in the art. An example is a PASHA cell structure. It is also known to provide a BSF by a separate doping step to provide heavier doping near the back surface of the cell. To create such a structure requires this separate doping step. It is considered to be an invention hereof to create such a doped BSF without a separate step for same, namely by creating the BSF during the growing phase of the wafer, along with the drift field, as explained above. Thus another invention hereof concerns a novel and non-obvious method of manufacturing such a structure, wherein the doping required to create the BSF is created during the wafer growth process according to the methods of discussed above.

It has been determined that in any particular system, such as using Silicon as the semiconductor, Boron as primary dopant, and Phosphorous as compensating dopant, an undesirable condition may arise. Recall that the compensating dopant is added to the bulk of the melt over time as many runs of wafers are made from the same vessel and melt, to keep the resistivity of each newly made wafer in a series of wafers made from this same melt, to be the same. This must be done despite the fact that there is increasing accumulation of the primary dopant (for instance the boron) in the melt over time.

Figure 8A:
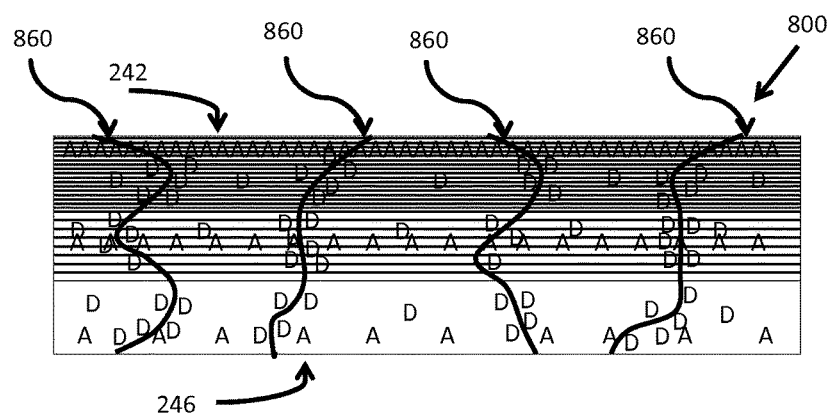
FIG. 8A is a schematic representation of a wafer of an invention hereof, showing segregation of donor compensating dopant atoms at the grain boundaries.
Figure 8B:
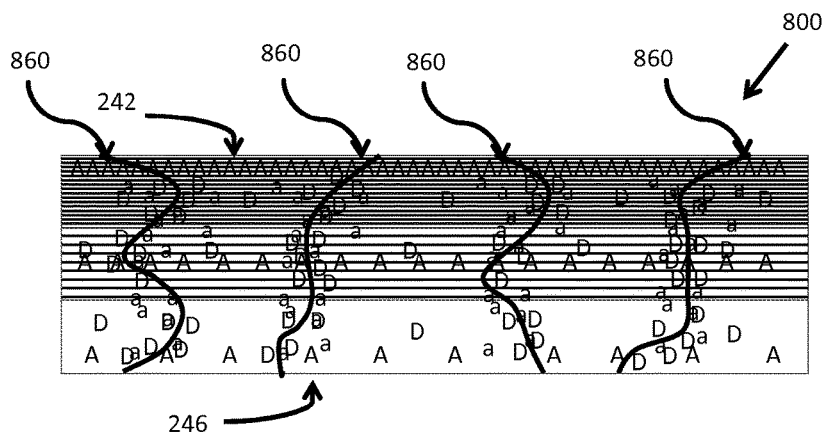
FIG. 8B is a schematic representation of a wafer of an invention hereof shown in FIG. 8A, also showing segregation of acceptor counter compensating dopant atoms at the grain boundaries.

The undesirable phenomenon is that the compensating dopant, having a lower segregation coefficient than the primary dopant, segregates more strongly to the grain boundaries. See for instance FIG. 8A, showing, schematically, a Si crystal 800, and accumulated low segregation coefficient compensating dopant D at the grain boundaries 860. This is generally undesirable, because the higher concentration of compensating dopant D near the grain boundaries 860 results in there being a higher concentration near the grain boundaries of the carrier type D that the compensating dopant entails (in the case of P, these are donors, and thus, the letter D is used to represent them). As such, there will be an electric field established within the grains directed toward the grain boundaries, and thus, minority carriers will be drawn to the boundaries. Such a condition is undesirable, because that is not where it is desired to direct these carriers. They are to be directed away from the surface 242 of the wafer with the higher concentration of the acceptor dopant A, toward the p/n junction (not yet formed, and thus not shown in FIG. 8A), which will be formed adjacent the surface 246, which has the lower concentration of the acceptor dopant A.

It has been determined that this undesirable effect can be overcome by the counter intuitive step of providing a $2^{nd}$ compensating dopant, which is referred to herein as a counter-compensating dopant, for example in the case of a Si/B/Ph system, a counter-compensating dopant of Aluminum (Al). The aluminum is the same type of carrier donor/acceptor as the primary dopant. Thus, aluminum is an acceptor, as is boron. It is most beneficial that the segregation coefficient of the counter compensating dopant be numerically smaller than that of the $1^{st}$ compensating dopant, and numerically, as close as possible to the value of the coefficient of the $1^{st}$ compensating dopant. Having a numerically smaller segregation coefficient, the counter compensating dopant migrates to the grain boundaries even more strongly than does the compensating dopant. Thus, it's acceptor/donor character cancels out, compensates, for the excess degree of donor/acceptors present from the relatively high concentration of compensating dopant at these boundaries.

In cases in which the segregation coefficient of the primary dopant is numerically lower than that of the 1$^{st}$ compensating dopant, it is not necessary to use a 2$^{nd}$, counter compensating dopant (and thus, the compensating dopant is simply a compensating dopant, not a first compensating dopant). A very useful combination for a Silicon semiconductor uses Boron for the primary dopant, Phosphorous for the compensating dopant, and Ga (Gallium) for the 2$^{nd}$ counter compensating dopant. B has the largest (least segregating) segregation coefficient, at 0.8 followed by P at 0.3 and Ga at 0.008.

Table C shows different combinations of Primary (substrate) dopant, compensating dopant and 2$^{nd}$ counter compensating dopant, for both P-type semiconductor crystals, such as Silicon, and N-type semiconductors, as shown in Table A, but with the further information relating to the counter compensating dopants. The segregation coefficient for each element is also provided at the first mention of the element.

TABLE C

Combinations of Primary, Compensating and Counter Compensating Dopant, for P-type and N-type Semiconductors

| P-Type | | | N-type | | |
| --- | --- | --- | --- | --- | --- |
| Primary dopant | comp dopant | counter comp dopant | Primary dopant | comp dopant | counter comp dopant |
| B (0.8) | P (0.3) | Al | P | B | As |
| Al (.002) | As (0.3) | Ga | As | Al | Sb |
| Ga (0.008) | Sb (0.023) | In | Sb | Ga | Bi |
| In (0.004) | Bi (0.0007) | | Bi | In | |
| B (0.8) | P (0.3) | Ga | | | |

The compounds listed in Table C above can be used for providing the counter compensating dopant as well as the primary and compensating dopants. In the case where both an n-type and p-type dopant is added to the melt, a compound semiconductor could be used to add the 2$^{nd}$, counter compensating dopant. For example with a Boron primary dopant, InP (Indium phosphide) could be used. The phosphorous would provide compensating doping, and the Indium would provide counter compensation, in the same manner as would Ga, in the table above. But the P and In would be provided as a compound agent, rather as individual additives.

EXAMPLES

Wafers have been grown and solar cells have been made. Solar cells show high efficiency at very low resistivity. For example solar cells made on wafers using this method having an average bulk resistivity of only 0.3 Ohm-cm had 2% higher efficiency than control wafers having a resistivity of 2.2 Ohm-cm. The doping profile shown schematically in FIG. 5 was measured by selectively removing layer after layer of silicon and measuring resistivity of the remaining wafer. In general, lower resistivity is present in regions with higher dopant concentration, and vice versa. (Doping was inferred by measuring resistivity, because measuring concentrations of material in a formed wafer is difficult, however, measuring resistivity, layer by layer, is not particularly difficult. Thus when considering infringement of claims herein, presence of a profile in resistivity, from one surface to another, may be considered to be evidence of a corresponding profile in dopant concentration. Furthermore, wafers exhibiting a profile in resistivity, with lesser resistivity at one surface (typically the back surface, not facing the sun, where there is a higher dopant concentration in p-type wafers), and higher resistivity at the other surface, which would be the sun facing surface, in that case, are considered to be an invention hereof, as are solar cells including such wafers, and methods of making such wafers.

The average net acceptor concentration was about 5×10$^{15}$/cm$^3$ with about 10 times more doping at the back (formed on mold facing side) surface. The cell had an aluminum back surface field, not a grown in BSF, as also discussed above. The boron dopant was about 1×10$^{18}$ atoms/cm$^3$. Impurity content was minimal, and, in any case, less than ten times the amount that would be present at equilibrium segregation. There was a range of compensating dopant from none (at the very beginning of the run) to about 1×10$^{18}$ atoms/cm$^3$ at the end of the run (in which approximately 2,000 wafers were made.

Inventions disclosed herein solve numerous problems. An invention hereof allows the low cost establishment of a dopant gradient from one surface of the formed wafer to the other. To date, methods known to establish a gradient in dopants in silicon wafers result in low quality silicon (such as gallium doped RGS (ribbon growth on substrate) or are very costly (epitaxial grown silicon).

It should be noted that many/any of the foregoing techniques to provide a wafer with a profile of doping level can be used with any others. For instance, the any of the modalities of providing dopant to the mold, for instance in a coating, in the body of the mold or near the surface of the mold, can be used with any of the methods of compensating for excessive dopant in the melt over time, and also any method of counter compensating for excessive segregation of the compensating dopant to the grain boundaries can be used with any other method of providing a doping profile. Provision of dopant to a degree and in locations to create a BSF can be used with any of the techniques for dopant compensation, and also for countering the accumulation of compensating dopant at the grain boundaries. Techniques for forming a dopant profile of any curve, or shape, can be used with the compensating and counter compensating techniques, and also with methods of forming a BSF.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

For instance, the invention of a drift field is not essential to the invention of a BSF, and vice versa. A drift field can be established that is gradual, and which does not have an extremely highly doped BSF. A BSF can be provided with a relatively highly doped region, and the rest of the wafer can be relatively uniform, essentially with no drift field, or with only a drift field of mild degree. It is not necessary to provide compensating dopant in a melt, either for single wafer formation, or even for a run of wafers, so long as the concentration of primary dopant in the melt does not become too large to form quality wafers. Other methods of dopant compensation can be used. Likewise, the method of counter compensating, to prevent excessive accumulation of the compensating dopant at grain boundaries, which is disclosed herein of providing a counter dopant with an even smaller segregation coefficient, need not be used. Such accumulation may be tolerated for some applications, or other methods of countering the accumulation could be used.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

ASPECTS OF INVENTIONS

The following aspects of inventions hereof are intended to be described herein, and this section is to ensure that they are mentioned. They are named aspects, and although they appear similar to claims, they are not claims. However, at some point in the future, the applicants reserve the right to claim any and all of these aspects in this and any related applications.

A1. A method for fabricating a semiconductor wafer for use as a solar collector, the method comprising the steps of:
  a. providing a molten semiconductor material, having a surface;
  b. providing a mold, comprising a forming surface, the mold also comprising a primary dopant relative to the semiconductor material;
  c. contacting the forming surface to the molten material such that dopant migrates from the mold into the molten semiconductor material; and
  d. maintaining conditions such that a body of semiconductor material in the form of a wafer solidifies upon the forming surface, with a first surface contacting the forming surface, the wafer having a profile of dopant concentration, there being a larger concentration of dopant at the first surface of the wafer, and a lesser concentration of dopant at a second surface of the wafer.

A2. A method for fabricating a semiconductor wafer for use as a solar collector, the method comprising the steps of:
  a. providing a molten semiconductor material, having a surface;
  b. providing a mold, comprising a forming surface, the mold also comprising a dopant relative to the semiconductor material;
  c. contacting the forming surface to the molten material for a contact duration such that for at least a portion of the contact duration dopant migrates from the mold into the molten semiconductor material; and
  d. maintaining conditions such that a body of semiconductor material in the form of a wafer solidifies upon the forming surface, the wafer having a profile of resistivity, there being a relatively lesser resistivity at a first surface of the wafer, and a relatively larger resistivity at a second surface of the wafer.

A3. The method of any one of aspects 1 and 2, further comprising the step of detaching the solidified wafer from the forming surface.

A4. The method of any one of aspects 1-3, the mold comprising a coating on one surface, which coating contains the primary dopant.

A5. The method of any one of aspects 1-3, the mold further comprising a body, wherein the primary dopant is distributed within the mold body.

A6. The method of any one of aspects 1-3, the mold further comprising a body, wherein the primary dopant is within the mold body at a higher concentration near one surface.

A7. The method of any one of aspects 1-6, the step of maintaining conditions comprising providing the primary dopant at the mold in a form for which the solidifying body of semiconductor acts as a diffusion barrier, such that as the solidifying body grows, initially primary dopant migrates at a first rate into the molten material, and the solidifying body, and subsequently, primary dopant migrates at lesser and lesser rates into the molten material and the solidifying body, so that portions of the body that solidify earlier have relatively more primary dopant per unit volume, as compared to portions of the body that solidify later.

A8. The method of any one of aspects 1-7, the primary dopant comprising a charge carrier of one type only of a donor and an acceptor type, further comprising;
  conducting steps a, b, c, and d (of aspect 1 or 2, as appropriate) at least two times;
  providing in the molten material, a quantity of compensating dopant of an opposite charge carrier donor/acceptor type to the primary dopant.

A9. The method of aspect 8, further comprising, the step of providing in the molten material, a quantity of counter compensating dopant of an opposite charge carrier donor/acceptor type to the compensating dopant.

A10. The method of aspect 9, the compensating and the counter compensating dopants each having an equilibrium segregation coefficient, the equilibrium segregation coefficient of the counter compensating dopant being equal to or less than the equilibrium segregation coefficient of the compensating dopant.

A11. The method of aspect 8 where the step of providing a quantity of compensating dopant is accomplished by providing the compensating dopant in the melt at a concentration $C_{cd}$ according to the following relation:

$$C_{cd} \text{ approximately equals } C_{md}*(k_{md}/k_{cd})$$

$C_{md}$ is the melt concentration of the primary dopant;
$C_{cd}$ is the melt concentration of the compensating dopant;
$k_{md}$ is the effective segregation coefficient of the primary dopant; and
$k_{cd}$ is the effective segregation coefficient of the compensating dopant.

A12. The method of aspect 1, the primary dopant concentration being less than or equal to $1 \times 10^{20}$ $N_x/cm^3$ at the first surface of the wafer and greater than or equal to about $1 \times 10^{15}$ $N_x/cm^3$ at the second surface of the wafer, where $N_x$ means for a charge carrier acceptor dopant, the number of charge carrier acceptors $N_a$ and, for a charge carrier donor dopant, the number of charge carrier donors $N_d$.

A13. The method of aspect 2 the primary dopant being a charge carrier acceptor, the resistivity being greater than or equal to 0.001 ohm-cm at the first surface of the wafer and less than or equal to about 10 ohm-cm at the second surface of the wafer.

A14. The method of aspect 1, the primary dopant concentration being less than or equal to $1 \times 10^{19}$ $N_x/cm^3$ at the first surface of the wafer and greater than or equal to about $1 \times 10^{17}$ $N_x/cm^3$ at the second surface of the wafer, where $N_x$ means for a charge carrier acceptor dopant, the number of charge carrier acceptors $N_a$ and, for a charge carrier donor dopant, the number of charge carrier donors $N_d$.

A15. The method of aspect 2, the primary dopant being a charge carrier donor, the resistivity being greater than or equal to 0.001 ohm-cm at the first surface of the wafer and less than or equal to about 0.1 ohm-cm at the second surface of the wafer.

A16. The method of any one of aspects 1 and 2, the semiconductor comprising a p-type semiconductor, the primary dopant being chosen from the group consisting of: boron, aluminum, gallium and indium.

A17. The method of any one of aspects 1 and 2, the semiconductor comprising an n-type semiconductor, the primary dopant being chosen from the group consisting of: phosphorous, arsenic, Antimony (Sb) and bismuth.

A18. The method of aspect 8, the semiconductor comprising a p-type semiconductor, the compensating dopant being chosen from the group consisting of: phosphorous, arsenic, antimony (Sb) and Bismuth.

A19. The method of aspect 8, the semiconductor comprising an n-type semiconductor, the compensating dopant being chosen from the group consisting of boron, aluminum, gallium and indium.

A20. The method of aspect 18, further comprising the step of providing in the molten material a counter compensating dopant selected from the group consisting of: aluminum, gallium and Indium.

A21. The method of aspect 19, further comprising the step of providing in the molten material, a counter compensating dopant selected from the group consisting of: arsenic, antimony and bismuth.

A22. The method of aspect 4, the molten material comprising silicon, the coating comprising a dopant selected from the group consisting of: $B_4C$ (boron carbide) and $B_4Si$ (boron silicide).

A23. The method of any one of aspects 1 and 2, the primary dopant comprising a compound selected from the group consisting of a carbide, an oxide, a nitride and a silicide, or an element selected from the group consisting of: boron, aluminum, gallium, indium, phosphorous, arsenic, antimony and bismuth.

A24. The method of any one of aspects 1 and 2, the step of maintaining being conducted so as to provide a concentration of primary dopant at the first surface of the wafer sufficiently high so as to establish a back surface field in a wafer used as a solar collector.

A25. The method of aspect 24, further comprising the steps of providing:
  a. coupled to the wafer, a metallic conductor in the form of an open grid, contacting the first surface of the wafer; and
  b. spaced from the first surface, an optical reflector, arranged such that the metallic conductor is between the first surface and the optical reflector.

A26. The method of aspect 1, the profile of dopant concentration having a shape that will give rise to a drift electric field within the wafer body directed to urge charge carriers in a preferred direction.

A27. The method of aspect 2, the profile of resistivity having a shape that will give rise to a drift electric field within the wafer body directed to urge charge carriers in a preferred direction.

A28. A semiconductor wafer for use as a solar collector, the wafer comprising a body having a first and a second surface, the body having a dopant concentration profile, there being a larger concentration of dopant at a first surface of the wafer, and a continuous transition to a lesser concentration of dopant at a second surface of the wafer, the larger concentration being at least three times the lesser concentration, further, where any metallic impurities that are present in the body are present at the first surface to a degree less than ten times the degree of metallic impurities that are present at the second surface.

A29. A semiconductor wafer for use as a solar collector, the wafer comprising a body having a first and a second surface, the body having a resistivity profile, there being a smaller resistivity at a first surface of the wafer, and a continuous transition to a larger resistivity at a second surface of the wafer, the larger resistivity being at least three times the smaller resistivity, further, where any metallic impurities that are present in the body are present at the first surface to a degree less than ten times the degree of metallic impurities that are present at the second surface.

A30. The semiconductor wafer of any one of aspects 28 and 29, the semiconductor comprising silicon, and the dopant comprising boron.

A31. The semiconductor wafer of any one of aspects 28 and 29, the semiconductor comprising silicon and the dopant being selected from the group consisting of: boron, aluminum, gallium and indium.

A32. The semiconductor wafer of any one of aspects 28 and 29, the semiconductor comprising a p-type semiconductor and the dopant being selected from the group consisting of: boron, aluminum, gallium and indium.

A33. The semiconductor wafer of any one of aspects 28 and 29, the semiconductor comprising an n-type semiconductor and the dopant being selected from the group consisting of: phosphorous, arsenic, Antimony (Sb) and bismuth.

A34. The semiconductor wafer of aspect 28, the dopant concentration being less than or equal to $1 \times 10^{20}$ $N_x/cm^3$ at the first surface of the wafer and greater than or equal to about $1 \times 10^{15}$ $N_x/cm^3$ at the second surface of the wafer, where $N_x$ means, for a charge carrier acceptor dopant, the number of charge carrier acceptors $N_a$ and, for a charge carrier donor dopant, the number of charge carrier donors $N_d$.

A35. The semiconductor wafer of aspect 29, the resistivity being greater than or equal to 0.001 ohm-cm at the first surface of the wafer and less than or equal to about 10 ohm-cm at the second surface of the wafer.

A36. The semiconductor wafer aspect 28, the concentration of primary dopant at the first surface of the wafer being sufficiently high so as to establish a back surface field in a wafer used as a solar collector.

A37. The semiconductor wafer aspect 29, the resistivity at the first surface of the wafer being sufficiently low so as to establish a back surface field in a wafer used as a solar collector.

A38. The semiconductor wafer of any one of aspects 36 and 37, further comprising:
  a. coupled to the wafer, a metallic conductor in the form of an open grid, contacting the first surface of the wafer; and
  b. spaced from the first surface, an optical reflector, arranged such that the metallic conductor is between the first surface and the optical reflector.

A39. The semiconductor wafer of aspect 28, the profile of dopant concentration having a shape that will give rise to a drift electric field within the wafer body directed to urge charge carriers in a preferred direction.

A40. The semiconductor wafer of aspect 29, the profile of resistivity having a shape that will give rise to a drift electric field within the wafer body directed to urge charge carriers in a preferred direction.

A41. A solar collector comprising a plurality of semiconductor wafers, each wafer comprising a body having a first and a second surface, the body having a dopant concentration profile, there being a larger concentration of dopant at a first surface of the wafer, and a continuous transition to a lesser concentration of dopant at a second surface of the wafer, the larger concentration being at least three times the lesser concentration, further, where any metallic impurities that are present in the body are present at the first surface to a degree less than ten times the degree of metallic impurities that are present at the second surface.

A42. A solar collector comprising a plurality of semiconductor wafers, each wafer comprising a body having a first and a second surface, the body having a profile of resistivity, there being a relatively lesser resistivity at a first surface of the wafer, and a continuous transition to a relatively larger resistivity at a second surface of the wafer, further, where any metallic impurities that are present in the body are present at the first surface to a degree less than ten times the degree of metallic impurities that are present at the second surface.

A43. The solar collector of any one of aspects 41 and 42, the semiconductor comprising silicon, and the dopant comprising boron.

A44. The solar collector of any one of aspects 41 and 42, the semiconductor comprising silicon and the dopant being selected from the group consisting of: boron, aluminum, gallium and indium.

A45. The solar collector of any one of aspects 41 and 42, the semiconductor comprising a p-type semiconductor and the dopant being selected from the group consisting of: boron, aluminum, gallium and indium.

A46. The solar collector of any one of aspects 41 and 42, the semiconductor comprising an n-type semiconductor and the dopant being selected from the group consisting of: phosphorous, arsenic, Antimony (Sb) and bismuth.

A47. The solar collector of aspect 41, the dopant concentration being less than or equal to $1 \times 10^{20}$ $N_x$/cm$^3$ at the first surface of the wafer and greater than or equal to about $1 \times 10^{15}$ $N_x$/cm$^3$ at the second surface of the wafer, where $N_x$ means, for a charge carrier acceptor dopant, the number of charge carrier acceptors $N_a$ and, for a charge carrier donor dopant, the number of charge carrier donors $N_d$.

A48. The solar collector of aspect 42, the resistivity being greater than or equal to 0.001 ohm-cm at the first surface of the wafer and less than or equal to about 10 ohm-cm at the second surface of the wafer.

A49. The solar collector of aspect 41, the concentration of primary dopant at the first surface of the wafer being sufficiently high so as to establish a back surface field in a wafer used as a solar collector.

A50. The solar collector aspect 42, the resistivity at the first surface of the wafer being sufficiently low so as to establish a back surface field in a wafer used as a solar collector.

A51. The solar collector of any one of aspects 49 and 50, further comprising:
  a. coupled to the wafer, a metallic conductor in the form of an open grid, contacting the first surface of the wafer; and
  b. spaced from the first surface, an optical reflector, arranged such that the metallic conductor is between the first surface and the optical reflector.

A52. The solar collector of aspect 41, the profile of dopant concentration having a shape that will give rise to a drift electric field within the wafer body directed to urge charge carriers in a preferred direction.

A53. The solar collector of aspect 42, the profile of resistivity having a shape that will give rise to a drift electric field within the wafer body directed to urge charge carriers in a preferred direction.

Having described the invention, what is claimed is:

The invention claimed is:

1. A method for fabricating a semiconductor wafer for use as a solar collector, the method comprising the steps of:
  a. providing a molten semiconductor material, having a surface;
  b. providing a mold, comprising a forming surface, the mold also comprising a primary dopant relative to the semiconductor material;
  c. contacting the forming surface to the molten material such that primary dopant migrates from the mold into the molten semiconductor material; and
  d. maintaining conditions such that a body of semiconductor material in the form of a wafer solidifies upon the forming surface, with a first surface contacting the forming surface, the wafer having a profile of primary dopant concentration, there being a larger concentration of primary dopant at the first surface of the wafer, and a lesser concentration of primary dopant at a second surface of the wafer.

2. The method of claim 1, further comprising the step of detaching the solidified wafer from the forming surface.

3. The method of claim 1, the mold comprising a coating on one surface, which coating contains the primary dopant.

4. The method of claim 1, the mold further comprising a body, wherein the primary dopant is distributed within the mold body.

5. The method of claim 1, the mold further comprising a body, wherein the primary dopant is within the mold body at a higher concentration near one surface.

6. The method of claim 1, the primary dopant comprising a charge carrier of one type only of a donor and an acceptor type, further comprising;
   conducting steps a, b, c, and d (of claim 1) at least two times;
   providing in the molten material, a quantity of compensating dopant of an opposite charge carrier donor/acceptor type to the primary dopant.

7. The method of claim 6, further comprising, the step of providing in the molten material, a quantity of counter compensating dopant of an opposite charge carrier donor/acceptor type to the compensating dopant.

8. The method of claim 7, the compensating and the counter compensating dopants each having an equilibrium segregation coefficient, the equilibrium segregation coefficient of the counter compensating dopant being equal to or less than the equilibrium segregation coefficient of the compensating dopant.

9. The method of claim 6 where the step of providing a quantity of compensating dopant is accomplished by providing the compensating dopant in the melt at a concentration $C_{cd}$ according to the following relation:

$C_{cd}$ approximately equals $C_{md}*(k_{md}/k_{cd})$ where:
   $C_{md}$ is the melt concentration of the primary dopant;
   $C_{cd}$ is the melt concentration of the compensating dopant;
   $K_{md}$ is the effective segregation coefficient of the primary dopant; and
   $k_{cd}$ is the effective segregation coefficient of the compensating dopant.

10. The method of claim 1, the primary dopant concentration being less than or equal to $1\times10^{20}$ $N_x/cm^3$ at the first surface of the wafer and greater than or equal to about $1\times10^{15}$ $N_x/cm^3$ at the second surface of the wafer, where $N_x$ means for a charge carrier acceptor dopant, the number of charge carrier acceptors $N_a$ and, for a charge carrier donor dopant, the number of charge carrier donors $N_d$.

11. The method of claim 1, the primary dopant concentration being less than or equal to $1\times10^{19}$ $N_x/cm^3$ at the first surface of the wafer and greater than or equal to about $1\times10^{17}$ $N_x/cm^3$ at the second surface of the wafer, where $N_x$ means for a charge carrier acceptor dopant, the number of charge carrier acceptors $N_a$ and, for a charge carrier donor dopant, the number of charge carrier donors $N_d$.

12. The method of claim 1, the semiconductor comprising a p-type semiconductor, the primary dopant being chosen from the group consisting of: boron, aluminum, gallium and indium.

13. The method of claim 1, the semiconductor comprising an n-type semiconductor, the primary dopant being chosen from the group consisting of: phosphorous, arsenic, Antimony (Sb) and bismuth.

14. The method of claim 6, the semiconductor comprising a p-type semiconductor, the compensating dopant being chosen from the group consisting of: phosphorous, arsenic, antimony (Sb) and Bismuth.

15. The method of claim 6, the semiconductor comprising an n-type semiconductor, the compensating dopant being chosen from the group consisting of boron, aluminum, gallium and indium.

16. The method of claim 14, further comprising the step of providing in the molten material, a counter compensating dopant selected from the group consisting of: aluminum, gallium and Indium.

17. The method of claim 15, further comprising the step of providing in the molten material, a counter compensating dopant selected from the group consisting of: arsenic, antimony and bismuth.

18. The method of claim 1, the molten material comprising silicon and the primary dopant comprising a compound selected from the group consisting of a carbide, an oxide, a nitride and a silicide, or an element selected from the group consisting of: boron, aluminum, gallium, indium, phosphorous, arsenic, antimony and bismuth.

19. The method of claim 1, the step of maintaining being conducted so as to provide a concentration of primary dopant at the first surface of the wafer sufficiently high so as to establish a back surface field in a wafer used as a solar collector.

20. The method of claim 1, the profile of dopant concentration having a shape that will give rise to a drift electric field within the wafer body directed to urge charge carriers in a preferred direction.

* * * * *